United States Patent
Preikszas et al.

(10) Patent No.: US 6,855,938 B2
(45) Date of Patent: Feb. 15, 2005

(54) OBJECTIVE LENS FOR AN ELECTRON MICROSCOPY SYSTEM AND ELECTRON MICROSCOPY SYSTEM

(75) Inventors: Dirk Preikszas, Oberkochen (DE); Michael Steigerwald, Aalen (DE); Peter Hoffrogge, Oberkochen (DE); Peter Gnauck, Reutlingen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 10/619,475

(22) Filed: Jul. 16, 2003

(65) Prior Publication Data

US 2004/0084629 A1 May 6, 2004

(30) Foreign Application Priority Data

Jul. 19, 2002 (DE) .......................................... 102 33 002

(51) Int. Cl.[7] ............................................ H01J 37/145
(52) U.S. Cl. ................... 250/396 R; 250/310; 250/311; 250/398
(58) Field of Search ...................... 250/396 R, 396 ML

(56) References Cited

U.S. PATENT DOCUMENTS

| | | | |
|---|---|---|---|
| 4,330,707 A | | 5/1982 | Manzke |
| 4,926,054 A | * | 5/1990 | Frosien .................... 250/396 R |
| 5,093,572 A | | 3/1992 | Hosono et al. |
| 5,623,183 A | * | 4/1997 | Allen et al. ................. 315/5.37 |
| 5,731,586 A | * | 3/1998 | Takashima ........... 250/396 ML |
| 6,590,210 B1 | | 7/2003 | Essers |
| 2001/0011702 A1 | | 8/2001 | Yonezawa et al. |
| 2002/0053638 A1 | * | 5/2002 | Winkler et al. ............. 250/306 |
| 2003/0010914 A1 | * | 1/2003 | Takane et al. .............. 250/310 |

FOREIGN PATENT DOCUMENTS

| | | |
|---|---|---|
| DE | 198 45 329 C2 | 9/2001 |
| EP | 0 333 018 A2 | 9/1989 |
| JP | 2002056794 A | 2/2002 |
| RU | 997135 | 2/1983 |

OTHER PUBLICATIONS

J. Frosien et al., "Compound magnetic and electrostatic lenses for low–voltage applications", J. Vac. Sci. Technol. B 7(8), Nov./Dec. 1989, pp. 1874–1877, American Vacuum Society.

* cited by examiner

Primary Examiner—John R. Lee
Assistant Examiner—Phillip A Johnston
(74) Attorney, Agent, or Firm—Burns, Doane, Swecker & Mathis, L.L.P.

(57) ABSTRACT

An objective lens with magnetic and electrostatic focusing for an electron microscopy system is provided whose at least partially conical outer shape allows orienting an object to be imaged at a large angle range in respect of an electron beam, said objective lens exhibiting, at the same time, good optical parameters. This is enabled by a specific geometry of the lens elements. Furthermore, an examination for the simultaneous imaging and processing of an object is proposed which comprises, besides an electron microscopy system with the above-mentioned objective lens, also an ion beam processing system and an object support.

51 Claims, 8 Drawing Sheets

OBJECTIVE LENS FOR AN ELECTRON MICROSCOPY SYSTEM AND ELECTRON MICROSCOPY SYSTEM

BACKGROUND OF THE INVENTION

1) Field of the Invention

The invention relates to an electron microscopy system with magnetic and electrostatic focusing and, in particular, to an objective lens for such a system. Furthermore, the invention relates to an examination system for imaging and manipulating an object, said examination system comprising such an electron microscopy system.

2) Brief Description of Related Art

In many technical fields and applications there is an increasing trend towards miniaturization. In particular, in semiconductor technology there is a demand for ever smaller, more complex and powerful devices. There is thus a demand, for example, in quality assurance and process analysis, to enable an optical inspection of the wafer as well as of devices being produced thereon and of the finished devices, respectively. Since the size of the individual structures of the devices is in the micrometer range and below, usually electron microscopes are used to obtain a necessary magnification and resolution. Particularly advantageous in this respect are such electron microscopy systems which allow imaging the structure to be examined at a great number of observation angles. With increasing wafer size, this puts specific demands on the electron microscopy system. In order to characterize a structure, in particular, a semiconductor structure, one technique applied is to "cut" a trench in the structure to be characterized in order to be able to inspect a cross-section through the structure and to thus obtain, with relatively little expenditure in work, a great amount of information, for example, regarding the layer sequences in the structure. Such a trench is, for example, etched into the semiconductor structure by means of a focused ion beam (FIB). This etching method is of importance in particular for the preparation of sample cross-sections for the transmission electron microscopy or in a structure with a complex layer sequence and different etch selectivity of the individual layers. Methods using a FIB enable the preparation of rather fine and well-defined cuts. The advantage of this method is to be able to microscopically observe the etch process in situ.

From the prior art various electron microscopy systems as well as a number of objective lenses for use in such systems are known. Such an objective lens which has proven to be advantageous provides a combination of magnetic and electrostatic focusing and deceleration, respectively.

An example of a conventional objective lens is schematically shown in FIG. 1. The objective lens 1 comprises a magnetic lens which is disposed rotationally symmetrically about an optical axis 2 of the objective lens and comprises a pole shoe arrangement with an inner pole shoe 11 and an outer pole shoe 12 as well as a coil body 15 disposed in a space between the inner and outer pole shoes 11, 12. Further, the objective lens 1 comprises an electrostatic immersion lens with a beam tube 13 defining a first electrode, and a terminal electrode 14. The beam tube 13 is substantially disposed in a lower part of an inner space formed by the inner pole shoe 11, while the terminal electrode 14 is spatially substantially contiguous to the outer pole shoe in z-direction. When current flows through the coil windings of the magnetic lens disposed between the pole shoes, a magnetic flux is induced in the inner pole shoe 11 and in the outer pole shoe 12, the pole shoe material carrying a large part of the flux. In a region of an axial pole shoe gap 19, a magnetic field clamped by the pole shoes 11, 12 emerges towards the optical axis 2. The magnetic field strength and extension of the magnetic field on the optical axis 2 are of importance for the focal depth. In this respect, the focal width is proportional to the acceleration voltage of the electrons divided by the position integral over the square of the magnetic flux density in the region of the pole shoe along the z-axis.

A positive voltage is applied to the beam tube 13 of the electrostatic lens, while the terminal electrode 14 is preferably set to earth potential. The electrostatic lens produces a deceleration field in which the electrons of the electron beam are slowed down prior to exiting from the electron optics. This enables the electrons of the electron beam to travel the major part of the beam path between the electron source and the electrostatic lens with high energy and speed, respectively, and thus phenomena of electrostatic repulsion of the equally charged electrons having a negative effect on the focusing can be minimized. The electric field between beam tube end and terminal electrode 14 further has an inhomogeneity in so far as this field likewise has a focusing effect on the primary electrons travelling therethrough.

Furthermore, it has been found to be favorable for a magnetic field generated by the magnetic lens of the objective lens to be relatively small on the surface of an object— as compared, for example, with so-called "single pole" lenses. As shown in FIG. 1, the objective lens 1 comprises a substantially conical outer pole shoe 12, a cone angle of an outer side of the outer pole shoe to the optical axis being 40°. Due to the geometry of the outer pole shoe 12 and the space required by the electron microscopy lens system, which is substantially determined by the geometry of the outer pole shoe 12, an object to be examined can be tilted, at a small working distance, up to an angle of 90°−40°=50° relative to the optical axis of the electron microscopy system.

An electron microscopy system which comprises such an objective lens was also advantageously used in a system for imaging and manipulating an object which, in addition, comprises an apparatus for producing and controlling a focused ion beam (hereinafter referred to as ion beam processing system or FIB column). In particular, such a system allows simultaneous imaging and processing of the structure. Due to the space required by the above-described objective lens of the electron-optical system as well as by the FIB column, a two-dimensionally extended object to be examined can be disposed maximally up to an angle of 80° relative to the ion beam when imaging and processing are performed simultaneously. Accordingly, in a system comprising such a conventional objective lens it is not possible to cut trenches with vertical walls into an object by means of the FIB and at the same time to carry out imaging through the electron microscope. Rather, after a step in which the object has been processed by the FIB, the object is tilted and rotated and subsequently the structure produced by the FIB is imaged.

When the electron microscopy system and the focused ion beam are simultaneously operated, a magnetic field generally needs to be minimized in the region of the object manipulated by the ion beam, because the ions are deflected by the magnetic field which results in an impairment of the processing accuracy of the focused ion beam. Moreover, in such a magnetic field the ion beam may be split into isotopes which might even fully exclude its usability.

Accordingly, there is a need for an objective lens for an electron microscopy system which requires less space and has a minimized magnetic field outside of the objective lens.

SUMMARY OF THE INVENTION

Therefore, it is an object of the invention to provide an improved objective lens for an electron microscopy system. Moreover, it is an object of the invention to propose an improved examination system for simultaneous imaging and manipulation of an object to be examined.

According to a first aspect, an objective lens is provided for an electron microscopy system with magnetic and electrostatic focusing for imaging an object positionable in an object plane, comprising:

a pole shoe arrangement for generating a focusing magnetic field, which pole shoe arrangement is substantially rotationally symmetric about an optical axis extending in a z-direction of the objective lens and comprises an inner pole shoe and an outer pole shoe, wherein a pole shoe gap is formed between the inner pole shoe and the outer pole shoe at a lowermost position in z-direction of the inner pole shoe where the latter has a gap spacing oriented in z-direction from the outer pole shoe, a coil body disposed in a space between the inner and the outer pole shoes; and an electrode arrangement for generating a focusing electrostatic field, which electrode arrangement is substantially rotationally symmetric about the optical axis and comprises: a beam tube which extends along the optical axis through the inner pole shoe and has a lower end, and further a terminal electrode disposed spaced apart from the lower end of the beam tube, wherein, in a region within at least 3 cm around the pole shoe gap, the following applies:

the inner pole shoe tapers downwards at least sectionally and has there an inner cone angle $\beta$ and an outer cone angle $\chi$ in respect of the z-direction, the outer pole shoe extends downwards, in particular, it tapers at least sectionally and has there an inner cone angle $\Delta$ and an outer cone angle $\alpha$ in respect of the z-direction, and wherein the objective lens is configured such that a working distance between the terminal electrode and the object plane is smaller than or equal to 2 mm for electrons which pass through the beam tube at about 30 keV, and $30°<\alpha<35°$ and $10°<\Delta-\chi<14°$, wherein $\alpha$ represents the outer cone angle of the outer pole shoe $\Delta$ represents the inner cone angle of the outer pole shoe and $\chi$ represents the outer cone angle of the inner pole shoe.

In particularly preferred embodiments, the objective lens furthermore comprises a coil body disposed in a space between the inner and outer pole shoes.

Basically, the geometry and arrangement of the components of the conventional objective lens were changed in order to be able to, according to a first aspect, reduce the angle between the conical outer pole shoe and the z-axis and thus to reduce the space required for the objective lens and thus the space required for the electron-microscopic system. As a result, a substantially two-dimensionally extended object can be tilted to a greater extent relative to the optical axis of the electron microscopy system.

The proposed change in the geometry of the conventional objective lens, which results in an objective lens solving the object(s) posed with optical parameters that are satisfactory for the electron microscopy system, is not obvious to the person skilled in the art. Rather, it is surprising for a number of reasons which are given here below:

In the magnetic lens of the objective lens, the inner pole shoe and the outer pole shoe are to carry the entire magnetic flux so that the magnetic field substantially emerges from the same only over the short distance of the pole shoe gap. Moreover, a magnetic saturation of the material the pole shoes are made of is to be avoided, because such a saturation would result in irreproducible and rotationally asymmetric magnetic fields and in a displacement of the magnetic flux out of the pole shoes. A focusing of electron beams rich in energy would be impaired in case of a pole shoe material saturation due to the attenuated magnetic field. As a result, it would be expected that a reduction of the space required for the magnetic lens by means of diminishing the thickness of the pole shoes, that is, removal of material, whilst maintaining the parameters applied for magnetically exciting the coil disposed between the pole shoes, would cause a premature magnetic saturation of the material and thus an unsatisfactory focusing performance of the objective lens. If one tried to reduce the magnetic lens in size by reducing the distance, i.e., the angle difference between the inner and the outer pole shoes, this reduction would result in a magnetic short-circuit and thus in disadvantageous interferences of the magnetic field, in particular, displacements, distortions and attenuations of the field along the optical axis. Moreover, this would reduce the space available for the coil. As a result, in order to maintain the number of windings of the coil required to provide sufficient excitation, a smaller diameter of the wire used for the coil would have to be selected. The higher ohmic resistance entailed by a smaller wire diameter, however, would increase the amount of heat generated by the wire of the coil, which would require a more complex cooling than the water cooling used in order to prevent spatial drift phenomena. Therefore, material removal from the pole shoes and/or a reduction of the distance between the inner and outer pole shoes do not appear to be appropriate measures for solving the object posed.

Together with a reduction of the angle $\alpha$ between the outer side of the outer pole shoe and a reduction of the thicknesses of the pole shoes, an arrangement of the pole shoes relative to each other, in particular, the difference of the angle between the outer angle $\chi$ of the inner pole shoe in respect of the z-axis and the inner angle $\Delta$ of the outer pole shoe in respect of the z-axis, as well as the dimension of the pole shoe gap or spacing were modified in a manner not rendered obvious by the prior art in order to arrive at a surprisingly powerful objective lens:

According to the invention, at least in a region within approximately 3 cm around the pole shoe gap, $\alpha$ is in a range of from 30° to 35° and the difference $\Delta-\chi$ is in a range of from 10° to 14°, wherein, with this arrangement, a working distance between the terminal electrode and the object plane of less than or equal to 2 mm is achieved for electrons passing through the beam tube at about 30 keV.

Here, the working distance is to be understood as distance between a lowermost region or a lower end of the terminal electrode and the object plane or an object disposed therein. At this working distance, an image with optimal resolution is achievable in the intended use or a resolution which is not substantially different from the specified resolution in the intended use.

However, the objective lens can be advantageously used also at larger working distances.

Particularly preferred is an arrangement wherein $\alpha=34°$ and $\Delta-\chi=13°$.

At a lowermost position of the inner pole shoe in z-direction, the latter has a gap spacing from the outer pole shoe oriented in z-direction where a pole shoe gap is formed between the inner and the outer pole shoes. In the region of the pole shoe gap, the magnetic field emerges in the direction of the optical axis. The dimensions of the pole shoe gap influence the strength and the spatial extension of the magnetic field on the optical axis and thus on the focal length of the objective lens. In optimizing the pole shoe geometry, the properties of the spherical and chromatic aberration must be weighed against the focusing performance which is reduced by the field attenuation caused by the material saturation or a too wide gap width. A pole shoe gap spacing of at least 3 mm is selected. As far as the definition of the spacing is concerned, it is to be noted that this is an effective pole shoe gap spacing, so to speak. This means that it is possible to reduce the pole shoe gap or pole shoe spacing under a geometric aspect, but not under a functional aspect, by the addition of further material in the form of, for example, a thin extension or thin films or foils. This added material, due to magnetic saturation in the added material, has no considerable influence on the magnetic field generated by the magnetic lens and thus on the magnetic field lines emanating from the inner and outer pole shoes, or the material is added at a position where there is hardly any flux anymore in the pole shoe anyhow.

In an advantageous embodiment of the invention, an inner side and an outer side of the inner pole shoe expand conically from a lowermost point in z-direction of the inner pole shoe. In an alternative preferred embodiment, the inner pole shoe is provided such that it extends from its lowermost end about 1 mm to 3 mm upwards in z-direction in the form of a cylinder sheath before it then conically expands at least on an outer side. Preferably, the outer pole shoe tapers downwards.

Preferably, the inner pole shoe has, at least at its lower end, an inner diameter of from 6 mm to 8 mm, an inner diameter of 7.5 mm being particularly preferred.

In general, the cone angles are preferably in the following ranges, taking into consideration the above-mentioned angle differences:
 inner cone angle $\beta$ of the inner pole shoe in respect of the z-axis: $0°<\beta<15°$,
 outer cone angle $\chi$ of the inner pole shoe in respect of the z-axis: $12°<\chi<\Delta-15°$
 inner cone angle $\Delta$ of the outer pole shoe in respect of the z-axis: $\alpha-5°<\Delta<\alpha+1°$.

The dimension of the radially innermost, lowermost region of the outer pole shoe axially disposed about the axis is preferably in a range of from 0.5 mm to 3 mm, the dimension of the radially innermost, lowermost region of the inner pole shoe axially disposed about the axis is preferably 10 mm and more.

Contrary to the expectations of the person skilled in the art, material was removed from the pole shoes as well as an angle difference between the pole shoes reduced whilst achieving a working distance of 2 mm and less despite a larger gap spacing.

In particularly preferred embodiments, a lower end in z-direction of the terminal electrode is spaced apart in z-direction from a lowermost region in z-direction of the outer pole shoe.

It is particularly preferred for the beam tube to be disposed such that it at least extends through an opening of the outer pole shoe, said opening being formed by a lowermost region in z-direction of the outer pole shoe. In particularly preferred embodiments, the beam tube extends through the opening of the outer pole shoe and the lower end of the beam tube is disposed such that it is spaced apart in z-direction from the opening of the outer pole shoe, i.e., it emerges from the pole shoe arrangement, in particular, from the opening of the outer pole shoe extending in parallel to the optical axis. It is thus particularly preferred for the lower end of the beam tube to be disposed in z-direction between the opening of the outer pole shoe and the lower end of the terminal electrode.

According to a further aspect of the invention, the objective lens is distinguished, as an alternative or in addition to the above-described specific geometric configuration of the magnetic lens (including the preferred embodiments) formed by the pole shoe arrangement, by a magnetic coupling of the outer pole shoe and the terminal electrode. This magnetic coupling is achieved in that the outer pole shoe, which is delimited on the outside substantially by a cone surface with a cone angle $\alpha$ in respect of the z-direction, and the terminal electrode, which is delimited on the outside substantially by a cone surface with a cone angle $\alpha'$ in respect of the z-direction, are magnetically coupled with each other without leaving a substantial gap to reduce the magnetic field on the object positionable in the object plane. This magnetic coupling causes improved shielding of the magnetic field towards regions outside of the objective lens. This is particularly advantageous in cases where the magnetic field disruptively interferes with the object or a sample or also in cases where the object under examination is simultaneously being processed by means of a focused ion beam, because the magnetic field would deflect the ions and thus impair the processing step.

It is particularly preferred that, according to this aspect, too, the objective lens is configured such that a working distance is smaller than 2 mm for electrons which pass through the beam tube at about 30 keV.

In a particularly preferred embodiment, the magnetic coupling between the terminal electrode and the outer pole shoe is achieved in that a gap between the terminal electrode and the outer pole shoe is smaller than 0.6 mm and, preferably, smaller than 0.2 mm. Such a gap between the terminal electrode and the outer pole shoe is advantageously formed in that the surfaces of a region of the terminal electrode and a region of the outer pole shoe are opposed to each other.

It is particularly preferred that the surfaces of an uppermost region in z-direction of the terminal electrode and the lowermost region in z-direction of the outer pole shoe are opposed to each other, the opposed surfaces being preferably disposed parallel to the z-direction. It is furthermore preferred that at least the surface of the region of the terminal electrode opposed to the outer pole shoe is disposed within the opening formed by the lowermost region in z-direction of the outer pole shoe.

It is particularly preferred for the terminal electrode to be held by a plastic insulation extending from a lower region of the outer pole shoe along the inner side of the inner pole shoe as well as by electrically insulated clamps. This allows, in particular, to set the terminal electrode, which is electrically insulated from the outer pole shoe by a gap, to a potential other than earth potential, which is advantageous for various applications. Further, this allows replacement of the terminal electrode independently of the outer pole shoe.

Moreover, an arrangement of the outer pole shoe and the terminal electrode is preferred, wherein the outer sides of the outer pole shoe and the terminal electrode, which extend at least partially substantially conically, are in alignment with each other.

It is advantageous for the terminal electrode to be formed such that it tapers substantially conically towards a central opening at a lower end of the terminal electrode so that the electric field is provided relatively close to an object or a sample. As the terminal electrode is preferably set to earth potential, the electric field is, however, negligibly small in a region of the sample. The proximity of the field to the sample is advantageous, in particular, at larger working distances $W_D$, i.e., distances between terminal electrode and sample surface. The inner diameter of the central opening of the terminal electrode corresponds substantially to an inner diameter of the beam tube. However, embodiments are provided in which the central opening at the lower end of the terminal electrode has an inner diameter which is different from that of the inner diameter of the beam tube.

According to a third aspect of the invention, the electric lens of the objective lens is—as an alternative to or in addition to the above-described specific geometric parameters of the magnetic lens and/or magnetic coupling of outer pole shoe and terminal electrode, including the preferred embodiments described in connection therewith—configured such that a distance $A_1$ between the lower end of the inner pole shoe and the lower end or the lowermost position in z-direction of the beam tube is larger than 9 mm and, further preferably, larger than 10 mm. This embodiment is particularly preferred for reducing the magnetic field in the object plane. It is particularly preferred and particularly advantageous in this embodiment for the lower end in z-direction of the beam tube to be disposed between the lowermost region of the outer pole shoe and the lower end of the terminal electrode. In a particularly preferred configuration, a distance $A_2$ between the lower end of the beam tube and a lower end of the terminal electrode is larger than 3 mm. Particularly preferred is a distance of approximately 6 mm.

This configuration is based on the idea to reduce an overlap between the magnetic field generated by the magnetic lens and the electric field generated by the electrostatic lens comprising the terminal electrode and beam tube as compared to the configuration known from the prior art. In particular, the overlap between the electric field and the magnetic field in such a lens geometry is less than 5% (based on the field integrals). Accordingly, the magnetic field generated by the magnetic lens has a larger distance from an object to be imaged, as a result of which a magnetic field in the object plane and on the object, respectively, is minimized. Reasons why this field minimization on the object is advantageous have already been discussed above. A further advantage of this configuration resides in the electric field being close to the sample which is particularly advantageous at larger working distances.

It is particularly preferred for the lower end of the beam tube to include an end flange which extends radially beyond an outer diameter of the beam tube. The end flange enclosing the beam tube is spaced apart from the terminal electrode at a distance which is large enough to prevent electric arc-overs or short circuits. This end flange is preferably formed such that its axial cross-section changes from a front face disposed towards the object plane into a sheath section of rounded shape, said rounding having a radius of curvature of at least one millimeter. The idea behind this specific configuration of the beam tube is to protect components of the objective lens made of plastic material disposed in the region substantially between the inner pole shoe and the beam tube from being charged by an electron cloud inevitably occurring during the operation of the electron microscopy system in that direct access to this region is impeded, so to speak, by the shielding provided by the end flange, and the primary electron beam is shielded similarly to Faraday's cage. The end flange may also be provided such that a transition from the inner wall of the beam tube limiting the inner diameter to the front surface is rounded.

In all of the above-described embodiments, preferably, a material is selected for the pole shoes which has a high saturation magnetization. An iron/nickel alloy with a nickel content of 45% to 50% is particularly preferred for the pole shoes is. A NiFe alloy which is commercially available from Vacuumschmelze Hanau, Germany, under the trade name "Permenorm 5000 H3" is particularly preferred. It is also advantageous to use a cobalt/iron/vanadium. (49% Co-49% Fe-2% V) alloy, cobalt/iron alloys (e.g., 30% Co, 70% Fe) or soft iron.

Preferably, the material used for the coil body comprises copper wire. The coil body is thermally insulated from the pole shoes. The heat generated by the current flowing through the coil body is absorbed by a water cooling pipe which is thermally coupled to the coil body and disposed in the inner space between the inner and the outer pole shoes and is transported off by the cooling circuit.

Preferably, a so-called $\mu$-metal (Mumetall®), i.e., a nickel/iron alloy with a nickel amount of 72–89%, particularly preferably, Hyperm 766, is selected for the terminal electrode.

Preferably, a plurality of deflection coils are provided in the objective lens for deflecting the electron beam so that the electron beam can scan over a defined region of an object surface. Besides the above-described objective lens, an electron microscopy system comprises further components: a sample chamber in which the object to be examined is positioned, an electron beam source for producing and accelerating an electron beam, electron optics with one or more electrostatic and/or magnetic lens(es), at least one vacuum system for evacuating at least those spaces of the electron microscope and the sample chamber which are traversed by the electron beam, an object support in the sample chamber for positioning and orienting an object in front of the electron microscope and at least one detector for detecting electrons, in particular, secondary electrons. In a preferred electron microscopy system, at least one detector is provided in an inner space of the electron microscope which is disposed in z-direction above the objective lens.

According to an additional aspect, the invention provides an examination system for observing and manipulating an object to be examined, comprising the following components:

an electron microscopy system with an objective lens exhibiting one or more features according to the above description, an ion beam processing system for manipulating the object by means of an emitted ion beam, an object support for holding and orienting the object in front of the ion beam processing system and the electron microscopy system, said object support enabling to orient a two-dimensionally extended object in front of the electron microscopy system such that the ion beam intersects the object surface orthogonally.

Considerable advantages are achieved by combining the above-described electron microscopy system with an ion beam processing system. The ion beam processing system is provided for generating and directing a focused ion beam by means of which an object to be examined is manipulated, for example, by removing material from a defined region of the surface of the object. Apart from the possibility of examining objects, e.g., in respect of their topography, there is also the possibility of performing repair works on lithographic masks or direct writing lithographic methods using this configuration. Apart from that, other possible of application are conceivable. The ion beam processing system comprises an ion source for producing an ion beam, for which often a liquid metal ion source (frequently gallium or indium) is used, as well as an extraction electrode for extracting ions from the ion source by applying an electric field. Furthermore, an ion optics of the ion processing system comprises at least one acceleration electrode, electrostatic lenses, a variable aperture and deflection units for accelerating, focusing, directing and deflecting the ion beam, respectively.

The electron microscopy system and the ion beam processing system are positioned relative to each other such that their optical axes substantially intersect in a plane defined by a surface of the object to be examined. The object is held by an object support which enables a defined orientation of the object in front of the electron microscopy system and the ion beam processing system. As a result, the angle at which the focused ion beam and the focused electron beam impinge on the object surface can be adjusted in a defined angle range. As a result, it is, for example, possible to generate holes and trenches with side walls of different steepness. In particular, the ion beam can be positioned vertically in respect of the object and thus allows the production of trenches with vertical side walls which are of great importance for certain applications.

BRIEF DESCRIPTION OF THE DRAWINGS

In the following, embodiments of the invention are explained in further detail with reference to Figures, wherein.

DETAILED DESCRIPTION OF EXEMPLARY EMBODIMENTS

Figure 3:
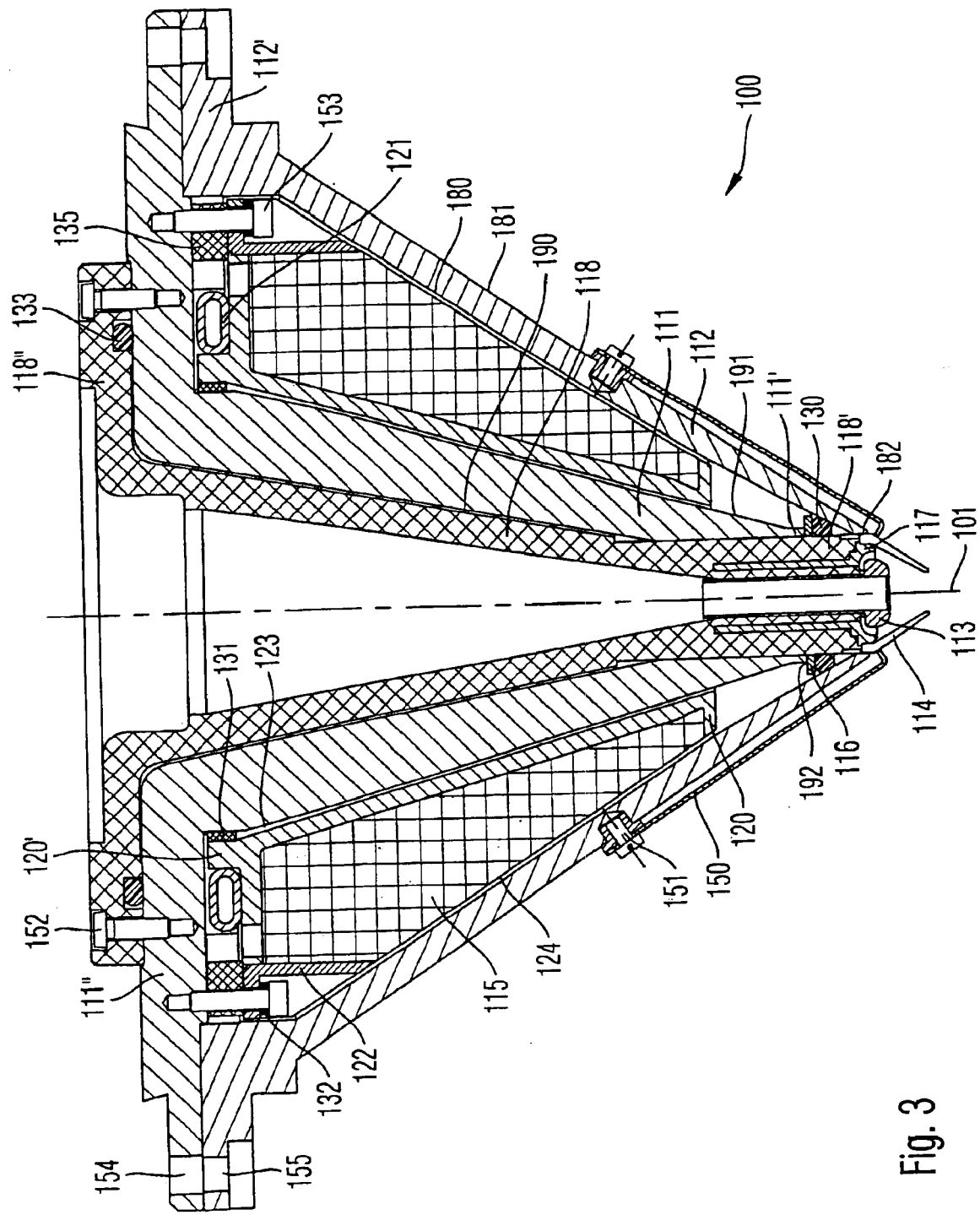
FIG. 3 is a cross-sectional view through an embodiment of the objective lens according to the invention.
Figure 4:
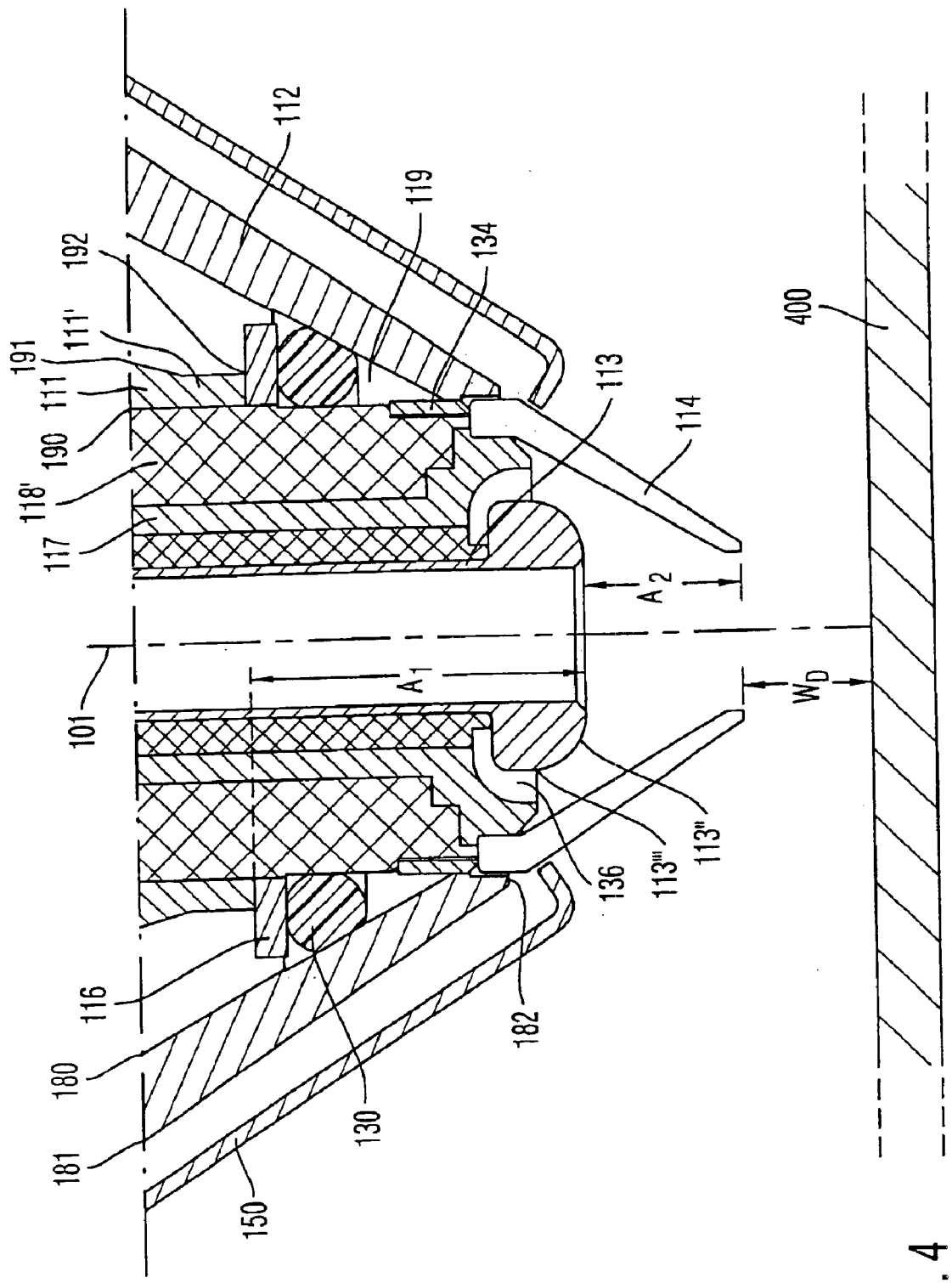
FIG. 4 is an enlarged section of FIG. 3.
Figure 5:
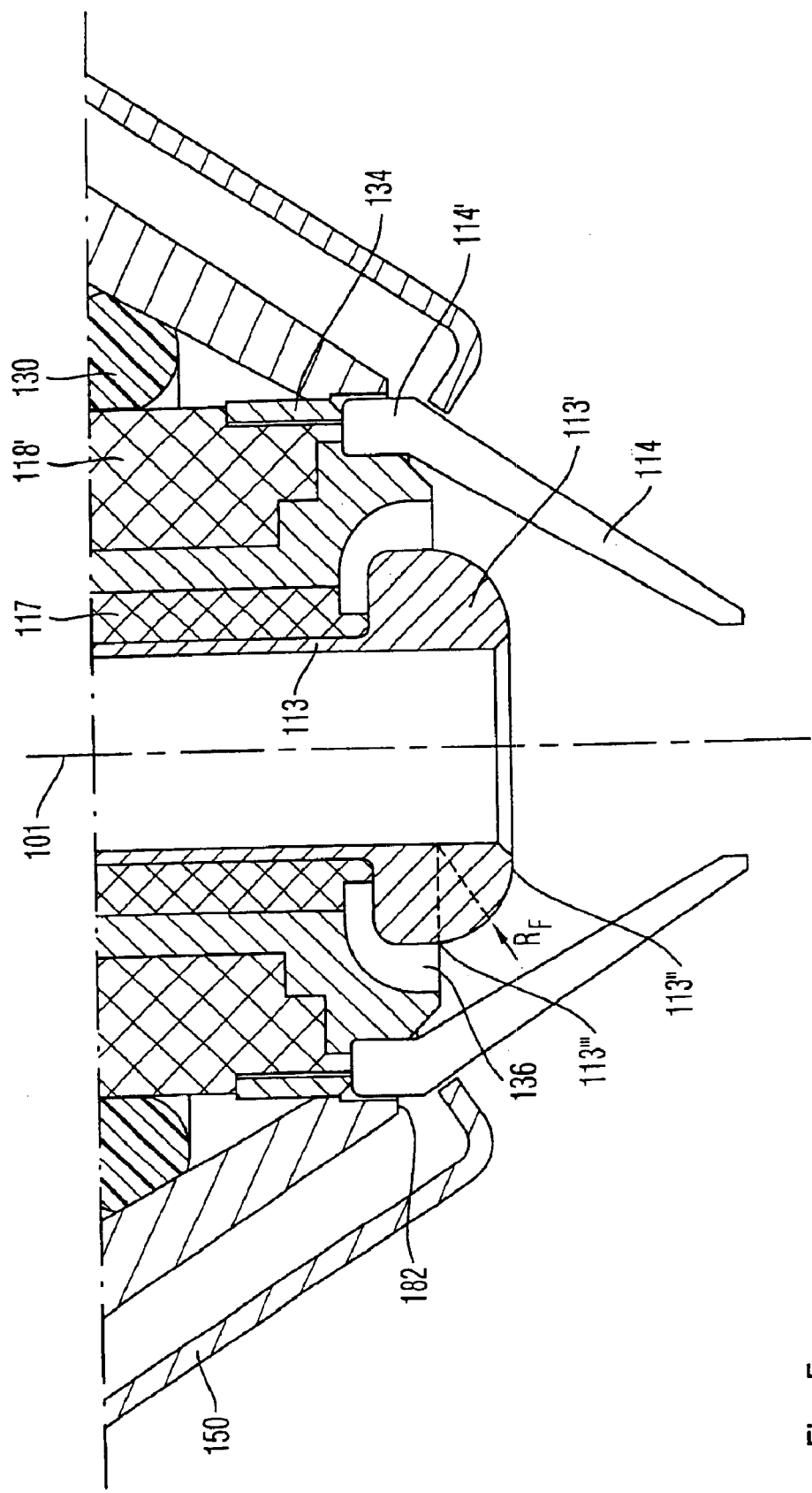
FIG. 5 is an enlarged section of FIGS. 3 and 4, respectively.

An objective lens 100 shown in FIGS. 3, 4 and 5 serves to focus an electron beam in an electron microscopy system. The objective lens 100 comprises a magnetic lens as well as an electrostatic lens. Accordingly, the focusing is effected both electrostatically and magnetically. The electrostatic lens also serves to decelerate the electrons of the primary electron beam. The magnetic lens comprises a pole shoe arrangement with an inner pole shoe 111 and an outer pole shoe 112. Both pole shoes 111, 112 are formed to rotationally symmetrically surround a central optical axis 101, i.e., the beam path of a primary electron beam.

The inner pole shoe 111 is, in z-direction, of substantially conical shape and tapers in this cone-shaped region continuously towards the object plane. In a lowermost region in z-direction of the inner pole shoe 111, the latter comprises a hollow-cylindrical region 111' which extends over about 2.2 mm in z-direction. The inner side 190 of the inner pole shoe 111 extends in z-direction from a lowermost position 192 first over about 32 mm parallel to the axis 101 and then along a cone with an angle β of 10.5° in respect of the z-axis until it extends into a radial flange 111" which in its outermost region is disposed opposite to a radial flange region 112' of the outer pole shoe 112. The outer surface 191 further remote from the axis 101 of the inner pole shoe 111 extends merely in the hollow-cylindrical region 111' over about 2.2 mm parallel to the optical axis and then extends into a cone with an angle χ of 16° in respect of the z-axis until it further extends into a radial flange portion 111" of the inner pole shoe.

Figure 1:
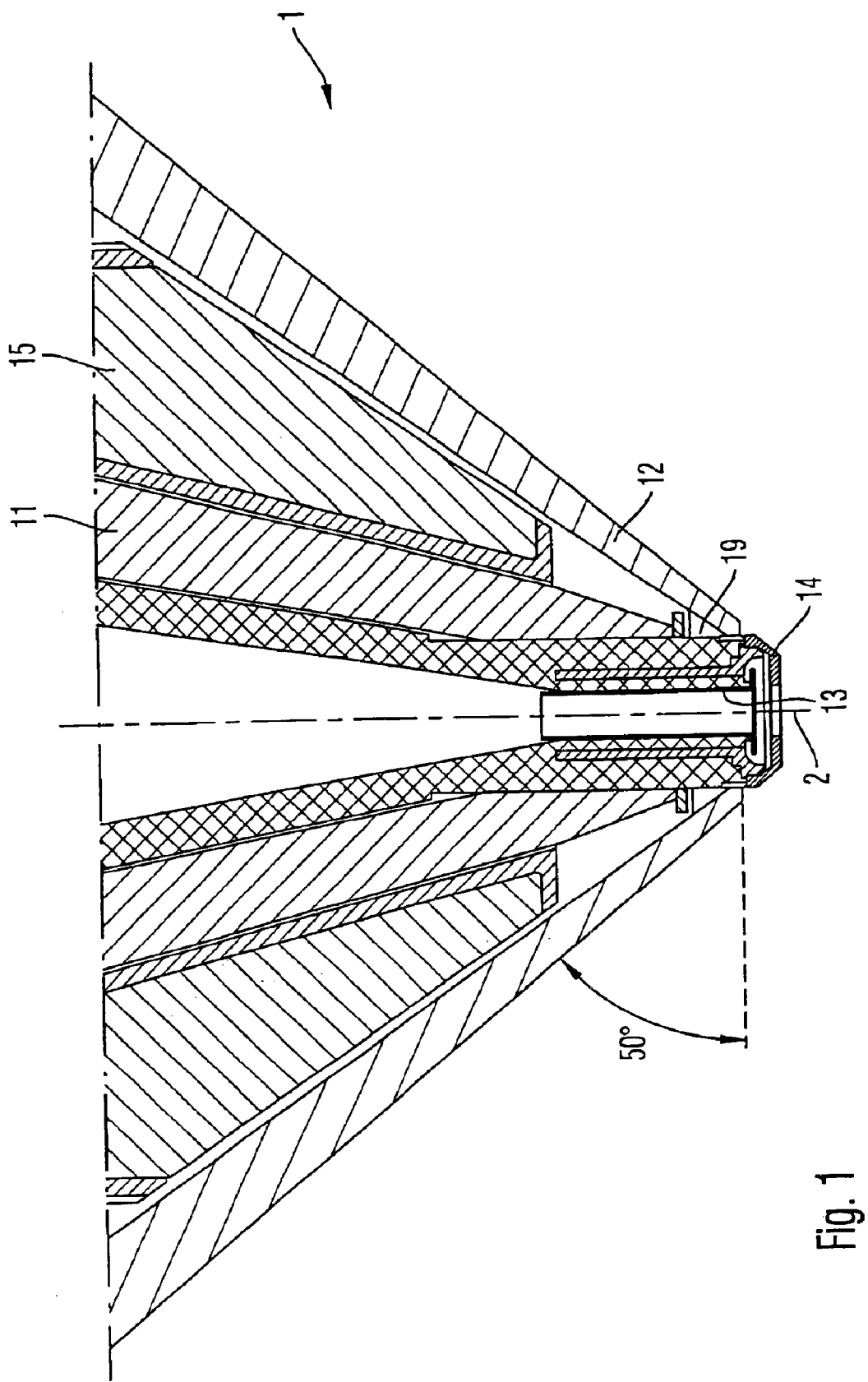
FIG. 1 is a cross-sectional view through a lower part of a conventional objective lens for an electron microscopy system.
Figure 2:
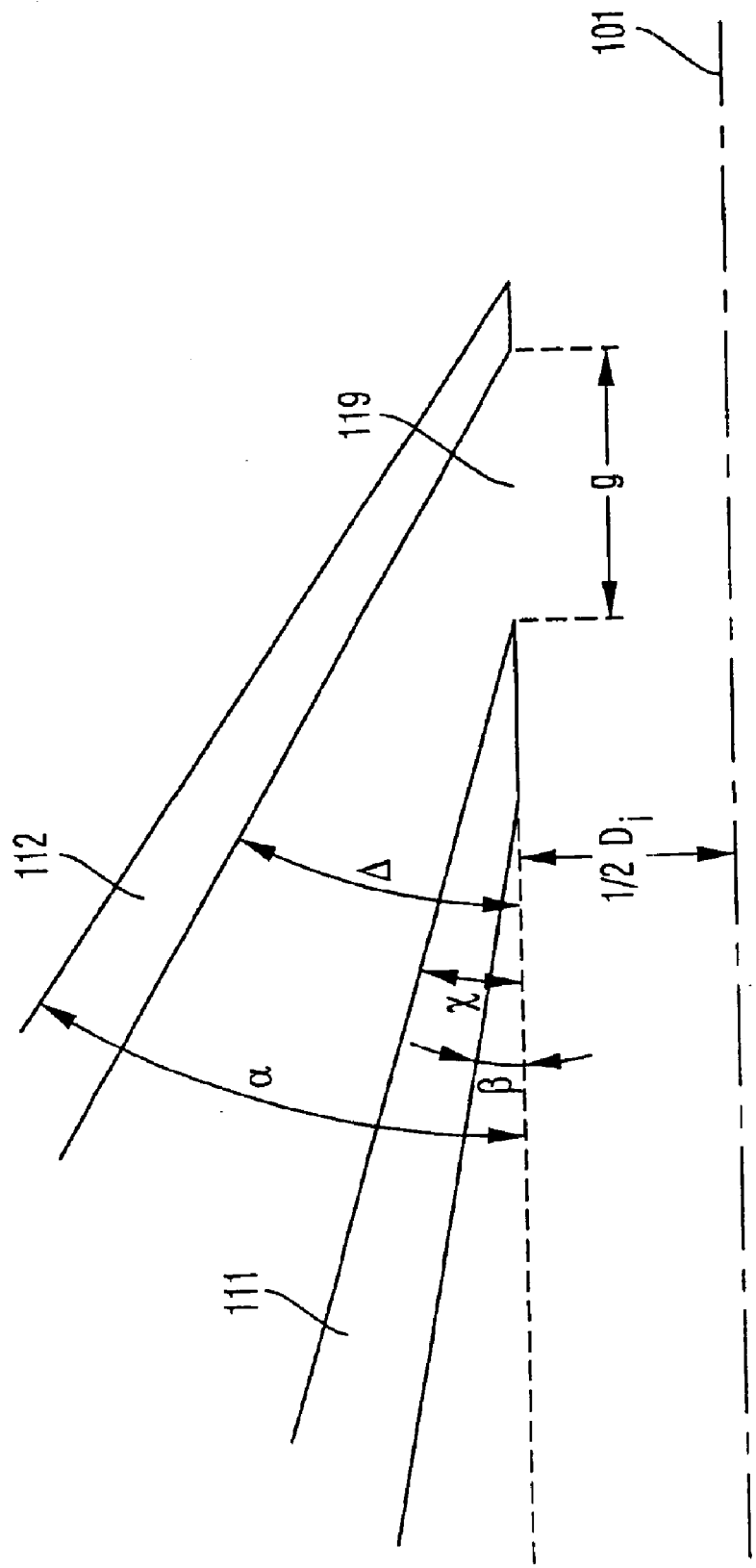
FIG. 2 is an illustration of the angles and dimensions defined in the description in the region of a pole shoe gap of the objective lens.

The outer pole shoe 112 extends substantially conically in z-direction up to an upper flange region 112'. An inner side 180 of the outer pole shoe 112 forms in this conical region an angle Δ of 29° in respect of the axis 101, while an outer side 181 extends radially outwardly at an angle α of 34° in respect of the axis 101. At a lowermost position 182 of the outer pole shoe 112 said outer pole shoe has a central opening, the inner diameter of which corresponds substantially to the inner diameter $D_i$ (see FIG. 2) of the opening in the inner pole shoe 111 at the lowermost position 192 in z-direction.

Due to the different cone opening angles of the inner and outer pole shoes 111, 112, a distance between the two pole shoes decreases towards the object plane and reaches a smallest dimension in a lower portion 111' of the inner pole shoe 111. Between the lowermost position 192 of the inner pole shoe 111 and the lowermost position 182 of the outer pole shoe 112, an axial pole shoe gap 119 with a pole shoe spacing is formed which extends parallel to the z-direction. In is embodiment, the pole shoe gap 119 has an axial length of about 6 mm.

The position and configuration of the pole shoe gap 119 is of great importance for the function of the magnetic lens. The pole shoes 111, 112 "clamp", so to speak, the magnetic field. The field lines extend between the upper and the lower pole shoe in a bulged shape towards the optical axis 101. A maximum field strength on the optical axis 101 is reached in the region of the pole shoe gap 119, the field strength of the generated magnetic field being substantially bell-shaped in z-direction.

In the embodiment shown in FIG. 3, a flat support ring 116 of non-magnetic material is disposed at the lowermost end 192 of the inner pole shoe 111 in the pole shoe gap 119, said support ring having the same inner diameter as the hollow-cylindrical region 111' of the inner pole shoe 111, but a larger outer diameter.

In the pole shoe gap 119, there is further provided a sealing ring 130 made of elastic material which abuts against regions of the support ring 116, the outer pole shoe 112 and a lower region of an insulation 118' and provides a seal to the space enclosed by the pole shoes 111, 122, from the vacuum space in the region of an object to be examined and within the electron microscopy system.

Figure 6:
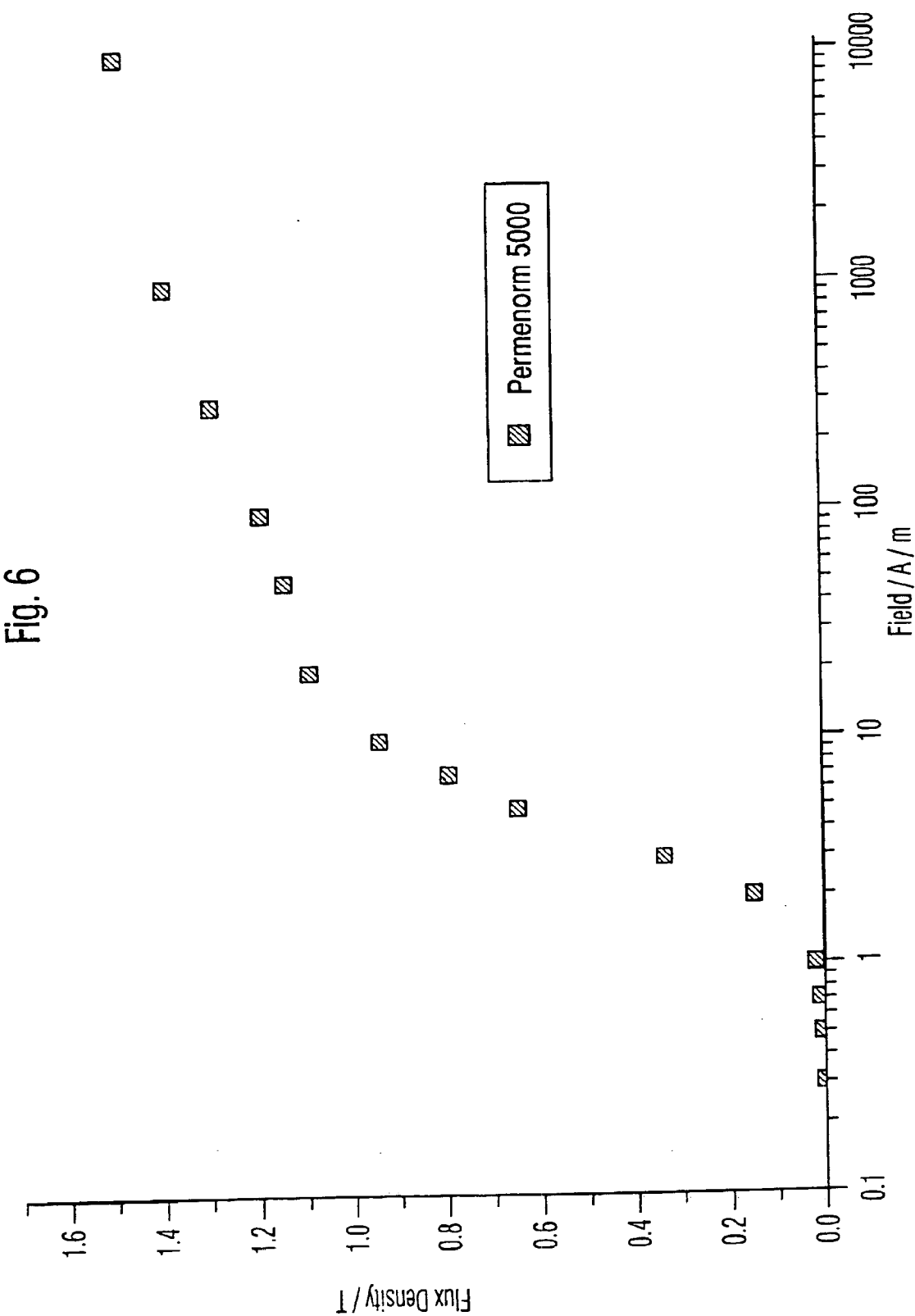
FIG. 6 is a diagram of the parameters field strength and flux density which are characteristic of a pole shoe material of an embodiment of the objective lens according to the invention.

The pole shoe arrangement is made of Permenorm® 5000 H3, an iron/nickel alloy, by turning and subsequently annealing. A diagram of the flux density and magnetization, respectively, of this material dependent upon the field is shown in FIG. 6.

In the inner space formed between the inner pole shoe 111 and the outer pole shoe 112, a coil body 115 is provided. The coil body 115 comprises wire coils disposed coaxially in respect of the optical axis which have a wire thickness of 0.8 mm and are made of copper. The number of windings is 650. The coils can be operated at a current of maximally 2 A.

A thermal output generated when current flows through the coils lies in the range of about 20 Watt. An epoxy resin is filled in between the coil windings which, after curing, provides thermal and mechanical stability.

The shape of the coil body 115 is substantially adapted to the shape of the inner space formed by the pole shoes 111, 112, without completely filling out this space. As a result, an upper side and an inner side and an outer side of the coil body 115 extend substantially parallel to the respective opposite surfaces of the pole shoe arrangement. A first sheath 120 encloses the coil body 115 without leaving a substantial gap at the outer side 191 of the inner pole shoe 111, substantially at its upper side and at a lower side. A second sheath 122 encloses the coil body 115 without leaving a substantial gap in a region of the outer side of the coil body 115 extending parallel in respect of the z-axis. The sheaths 120, 122 are made of copper and serve to receive and transport off heat which is generated in the wire coils of the coil body 115 when current flows therethrough.

Between the first sheath 120 and the outer side 191 of the inner pole shoe 111, there is left a gap 123 extending over the entire region of the inner pole shoe 111 disposed opposite to the first sheath 120 to provide a thermal insulation and to substantially prevent a heating of the pole shoe material. In an uppermost region in z-direction of the inner pole shoe 111, a ring-shaped spacer 131 is inserted between a short vertical extension 120' of the first sheath 120 and the outer side 191 of the inner pole shoe 111 to prevent the pole shoe 111 from contacting the first sheath 120 and to provide the gap 123. The vertical extension of the first sheath 120 goes over and further extends into horizontal direction radially outwardly into a horizontal tube 121 through which cooling water flows. A gap 124 is left between the outer pole shoe 112 and the coil body 115 for thermal insulation.

The second sheath 122 is of substantially inverted L-shape and extends parallel to a section of the outer side of the coil body 115 extending parallel to the axis 101, and it further extends in horizontal direction contiguous with the first sheath 120 and has a bore for receiving a screw 153 provided for connecting the inner pole shoe 111 and the coil body 115 with the sheaths 120, 122 by use of a connecting body 135. A washer 132 is provided between a head of the screw 153 and the second sheath 122. The flange region 111" of the inner pole shoe 111 as well as a flange region 112' of the outer pole shoe 112 opposite thereto comprise bores 154 and 155 which are in alignment with each other for screw connecting the two pole shoes 111, 112. Moreover, the outer pole shoe 112 is of a stepped configuration at its outer side 181 in the region where it changes from the cone shape to the flange portion 112', said stepped configuration serving to fit the pole shoe arrangement into a corresponding accommodating part of the electron microscopy system.

An insulation 118 made of plastic material extends parallel to and along the inner side 190 of the inner pole shoe 111 in a lower region beyond a lowermost end 192 of the inner pole shoe 111 to about a lowermost position 182 of the outer pole shoe 112. In an upper region, the insulation 118 extends parallel to the inside of the pole shoe 111 and further extends as a flange region 118" which extends approximately to the middle of the flange region 111" of the inner pole shoe 111. In a peripheral region of the flange portion 118" of the insulation 118, a bore is provided for receiving a screw 152 connecting the insulation 118 with the inner pole shoe 111. In a flange portion 118" of the insulation 118, there is likewise disposed in a side of the insulation 118 disposed towards the inner pole shoe 111 an annular recess for receiving a ring 133. In a conical region of the inner side of the inner pole shoe 111, the insulation 118 is spaced apart from the inner pole shoe 111, leaving a gap therebetween. Just like the inner pole shoe 111, the insulation 118 assumes a hollow-cylindrical shape 118' in a lower region. In this hollow-cylindrical region 118' of the insulation 118, the latter has an annular recess 117 which extends almost over the entire height of the hollow-cylindrical region, said recess receiving saddle-shaped deflection coils, not shown, for further deflecting the electron beam.

The beam tube 113 forming a first electrode of the electrostatic lens is fitted into the inner radius of the hollow-cylindrical region 118' of the insulation 118. The beam tube 113 extends in z-direction both beyond an upper end and a lower end of the hollow-cylindrical region 118' of the insulation 118. The inner diameter of the beam tube 113 is about 4.5 mm. A lower or lowermost end of the beam tube 113 is spaced apart from the lowermost position or the lower end 182 of the outer pole shoe 112 at a distance of about 5 mm. As apparent particularly from FIG. 5, in this embodiment, the beam tube 113 has an end flange 113' whose axial cross-section has a rounded shape and has a diameter of about 8.5 mm at its largest, radially outwardly extending extension. The end flange 113' changes from a rounded front face 113" disposed towards the object plane into a sheath section 113'" disposed substantially parallel to the axis 101, the radius of curvature $R_f$ of this rounding being about 2 mm. The lowermost portion of the insulation 118 disposed towards this end flange 113' and the shape of the end flange 113' of the beam tube 113 are adapted to each other such that their surfaces are disposed substantially in parallel and thus a gap 136 of semi-circular shape is formed around the end flange 113' at equal distance. The end flange 113' serves to protect the plastic material of the insulation 118 from electrons and from a charging caused thereby. In the lowermost region of the insulation, a recess is provided for receiving a ring 134 which abuts against a region of the outer pole shoe on a side disposed away from the insulation.

Furthermore, the electrostatic lens of the objective lens 100 comprises a terminal electrode 114 as a second electrode. This terminal electrode 114 is of substantially conical shape, with an angle between an outer side of the terminal electrode 114 and the axis 101 being equal to the angle a between the outer side 181 of the outer pole shoe 112 and the axis 101, the outer pole shoe 112 and the terminal electrode 114 being in alignment with each other. The terminal electrode 114 tapers in z-direction up to a central opening having an inner diameter of about 5 mm. At an upper end of the terminal electrode 114, the latter extends into an annular or hollow-cylindrical region 114', an outer surface of this annular region 114' being opposed to an axial inner surface of the outer pole shoe 112. And the gap formed therebetween with a width of about 150 μm being narrow enough to enable a magnetic coupling of the terminal electrode 114 and the outer pole shoe 112. As a result, a still better shielding of the magnetic field in the objective lens 100 from a region outside the objective lens 100 is achieved.

Figure 7:
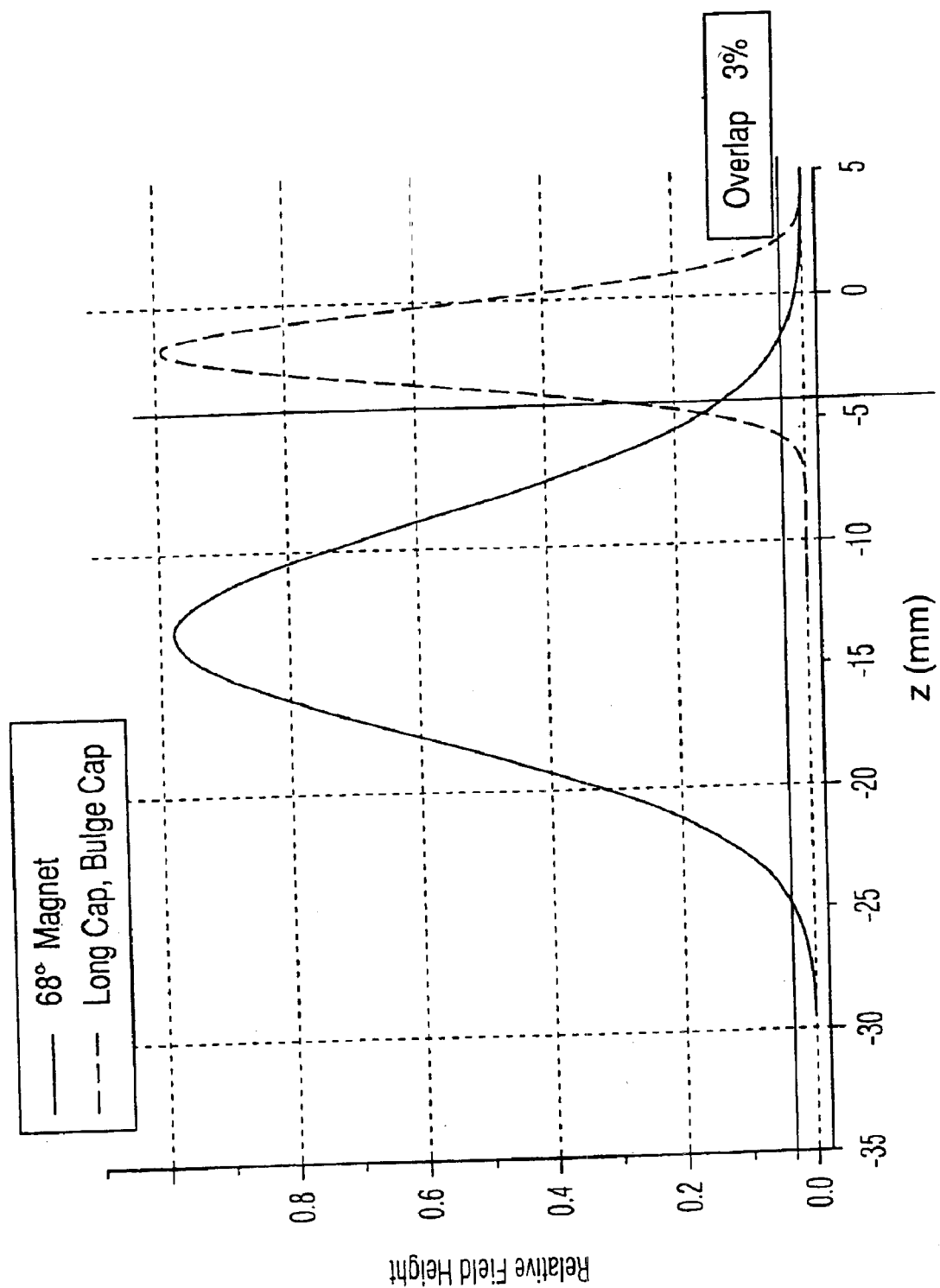
FIG. 7 is a diagram of the overlap between an electric field and a magnetic field in an embodiment of the objective lens according to the invention.

The lower end of the beam tube 113 is spaced apart in z-direction from a lowermost position or the lower end of the terminal electrode 114 at a distance $A_2$ of about 5 mm. While a positive voltage of 8 kV is applied to the beam tube 113, the terminal electrode 114 is preferably set to earth potential. By selecting these distances of the electrodes 113, 114 of the electrostatic lens from each other and from the pole shoe arrangement to be larger as compared to the prior art, the electrostatic deceleration and focusing field is largely separated from the magnetic field generated by the pole shoe arrangement. The fields of the two lenses overlap in a region of less than 5% of their field integrals, as evident from the diagram of FIG. 7. (The terminal electrode with end flange is designated as "Long Cap, Bulge Cap" in the legend of FIG. 7).

The terminal electrode 114 is made of Mumetall®, namely a material available under the name Hyperm 766 from Vakuumschmelze Hanau, Germany.

The terminal electrode 114 is held by two opposed clamps 150 which are fastened in an upper region to the outer pole shoe 112 by means of screws 151. The clamps 150 are disposed in their lower region at an uppermost cone-shaped section of the terminal electrode 114. The terminal electrode 114 is held and centred by the insulation 118'. In order to electrically insulate the clamps 150 from the outer pole shoe 112, ceramic insulation material is used under the screw 151 connecting the outer pole shoe 112 and the clamp 150. This configuration or support allows the easy replacement of the terminal electrode 114. In addition, the terminal electrode 114 can be set electrically insulated from the outer pole shoe 112 to a potential other than earth potential.

FIG. 4 shows, in addition, an object 400 to be examined as well as a working distance $W_D$ between the lower end of the terminal electrode 114 and a surface of the object 400 as well as the distances $A_1$ and $A_2$.

Figure 8:
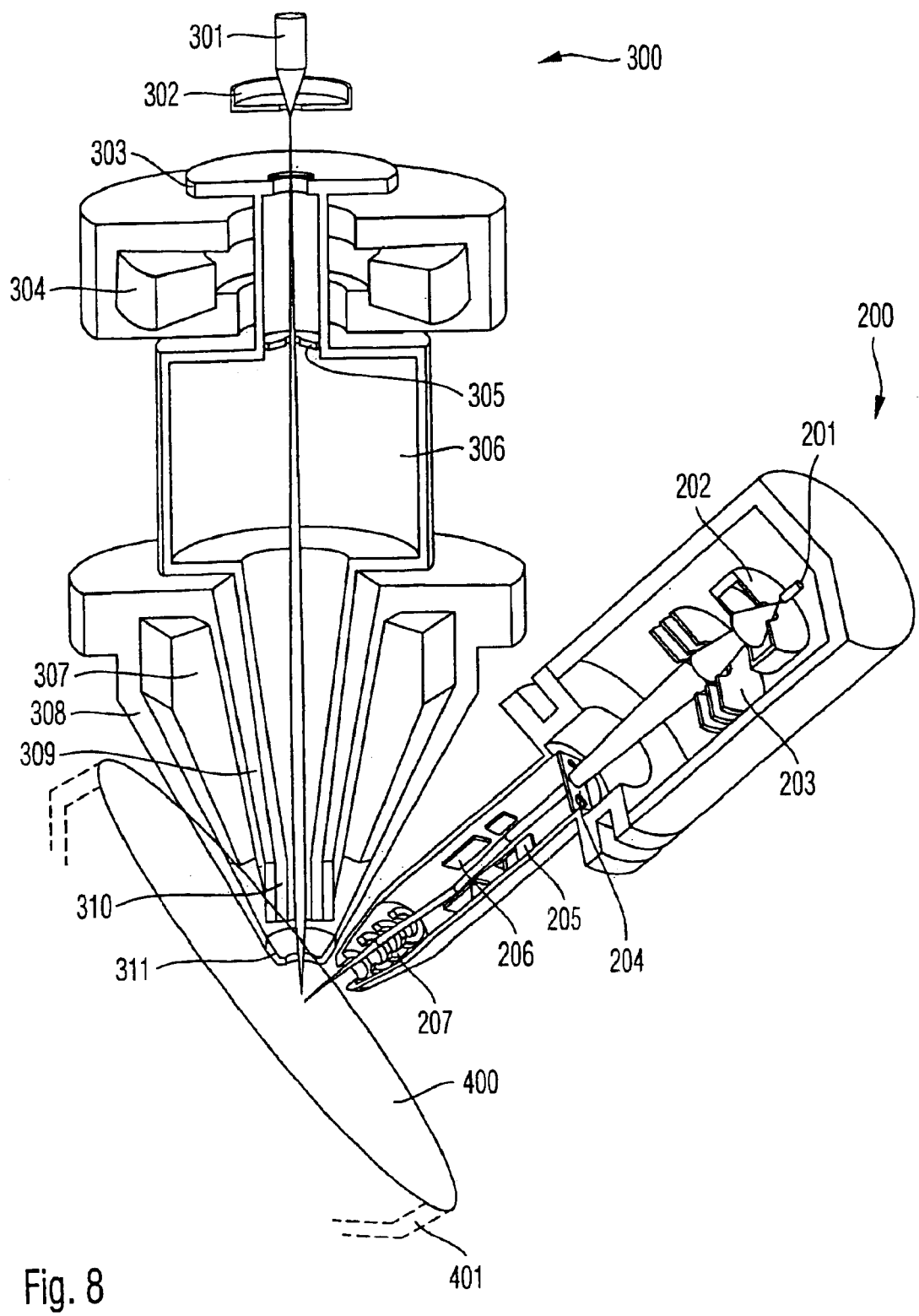
FIG. 8 is a schematic representation of an examination system according to the invention, for imaging and manipulating an object.

In FIG. 8, an embodiment of the examination system for imaging and manipulating an object 400 is shown in schematic, simplified form. The examination system comprises an electron microscopy system 300 for imaging a region of the object 400 as well as an ion beam processing system 200 for manipulating the object 400.

As is evident from FIG. 8, the optical axes of the electron microscopy system 300 and the ion processing system 200 intersect substantially in a plane defined by the plane surface of the object 400, the optical axis of the ion beam processing system 200 extending approximately orthogonally to this plane and the ion beam correspondingly impinging vertically on a surface of the object 400. The angle at which the electron beam impinges on the object 400 in the configuration shown in the Figure is about 35°, while the working distance, i.e., the distance between the surface of the object 400 and the lowermost, radially innermost position in the central opening of the terminal electrode, is approximately 4 mm.

In the electron microscopy system 300, a primary electron beam is produced by an electron beam source which comprises a cathode 301, preferably a Schottky field emitter, and an anode 303 disposed opposite to the cathode 301. The emitted electrons also pass through an extractor 302 disposed between the cathode 301 and the anode 303. The accelerated primary electron beam passes through a bore at the bottom of the anode 303 and is subsequently collimated by a collimator system 304. After having passed through an aperture stop 305, the electron beam passes through an inner space 306 of the electron microscopy system 300 in which a detector, not shown, for detecting secondary electrons or back-scattered electrons is disposed. The electron beam is focused by means of the magnetic lens formed of the pole shoe arrangement with inner pole shoe 309 and outer pole shoe 308 as well as the coil body 307 disposed therebetween, and the electrostatic lens 310, 311, which together form the objective lens. In the objective lens, additionally saddle coils are disposed symmetrically about the beam path for deflecting the electron beam. The electron beam emerges from the objective lens and impinges at an angle of approximately 35° at a working distance of approximately 4 mm on the object surface. The objective lens has already been described in detail with reference to the above embodiment.

The ion processing system 200 comprises an ion source 201 which comprises a configuration with a drop of liquid gallium at the tip thereof from which an ion beam is extracted by means of an extraction electrode 201. When passing through the ion optics of the FIB column 200, the ion beam successively passes, illustrated in simplified manner, through a collimator 203, a variable stop 204, a set of electrodes 205 and 206 for deflecting and orienting the ion beam and finally an arrangement of beam-shaping individual lenses 207, before the ion beam exits from the FIB column.

In FIG. 8 the focused ion beam impinges on the object at about right angle to the object surface so that trenches or holes with vertical walls can be produced in the object surface, this processing being simultaneously observed by the electron microscopy system.

Moreover, FIG. 8 shows an object support 401 for holding and orienting the object 400 in front of the electron microscopy system 300 and the ion beam processing system 200.

A great advantage of the system according to the invention resides in that it allows observing and processing the object at the same time. An imaging of the object processing in situ is particularly important for the end point determination during the fabrication of particularly complex and/or small structures. Simultaneous processing and imaging is enabled, among others, by the magnetic field of the magnetic lens of the objective lens of the electron beam microscopy system being shielded by the objective lens such that in the region of the object surface and the space traversed by the ion beam, respectively, a magnetic field is so small that no or only a negligibly small disruptive influence is imparted on the ion beam. This is of great advantage in particular as compared to so-called "single pole" objective lenses the space required by which can be kept relatively small, but which inherently generate a large magnetic field in the region of the object and thus cannot be used simultaneously with a focused ion beam.

Based on an angle of 34° or less between the outer side of the outer pole shoe of the objective lens of the electron microscopy system and an angle of 20° between an outer side of the FIB column which is conically shaped at least in a lower region disposed towards the object and the optical axis thereof (half angular opening), the FIB column and the electron microscopy system can be disposed in a plane normal to the objective plane such that in this plane covering 180° of the focused ion beam can impinge on the object at an angle of about 21° to (180°−2×34°−20°=) 92° and the electron beam can impinge at the same time on the object at an angle of about (0°+2×20°+34°=) 74° to (180°−34°=) 146°, the angle between the electron beam and the ion beam being always at least (20°+34°=) 54°. As a result, the focused ion beam can, for example, also be directed on the object plane at an angle deviating from the orthogonal by about 2° in each direction. This is of importance, for example, for producing samples for transmission electron microscopy.

The present invention has been described by way of exemplary embodiments to which it is not limited. Varia-

What is claimed is:

1. An objective lens for an electron microscopy system with magnetic and electrostatic focusing for inspecting an object positionable in an object plane, comprising:
    a pole shoe arrangement for generating a focusing magnetic field, which pole shoe arrangement is substantially rotationally symmetric about an optical axis of the objective lens extending in a z-direction and comprises an inner pole shoe and an outer pole shoe, wherein a pole shoe gap is formed between the inner and outer pole shoes at a lowermost position in the z-direction of the inner pole shoe, the pole shoe gap including a gap spacing oriented in the z-direction between the outer pole shoe and the inner pole shoe;
    a coil body disposed in a space between the inner and the outer pole shoes; and
    an electrode arrangement for generating a focusing electrostatic field, which electrode arrangement is substantially rotationally symmetric about the optical axis and comprises a beam tube which extends along the optical axis through the inner pole shoe and has a lower end, and a terminal electrode disposed spaced apart from the lower end of the beam tube,
    wherein, in a region within at least 3 cm around the pole shoe gap, the following applies:
        the inner pole shoe tapers downwards over at least a section of the inner pole shoe and has there an outer cone angle $\chi$ with respect to the z-direction,
        the outer pole shoe extends conically downwards over at least a section of the outer pole shoe and has there an inner cone angle $\Delta$ and an outer cone angle $\alpha$ with respect to the z-direction, and
        the objective lens is configured to allow a working distance between the terminal electrode and the object plane smaller than 2 mm for electrons which pass through the beam tube at energies of about 30 keV, and
    wherein the following applies:
        $30° < \alpha < 35°$ and $10° < \Delta - \chi < 14°$,
    wherein
        $\alpha$ represents the outer cone angle of the outer pole shoe
        $\Delta$ represents the inner cone angle of the outer pole shoe and
        $\chi$ represents the outer cone angle of the inner pole shoe.

2. The objective lens according to claim 1, wherein the outer pole shoe is delimited on the outside substantially by a cone surface with the cone angle $\alpha$ with respect to the z-direction, wherein the terminal electrode is delimited on the outside substantially by a cone surface with respect to the z-direction, and wherein the terminal electrode is magnetically coupled to the outer pole shoe via a gap between the terminal electrode and the outer pole shoe for reducing the magnetic field in the object plane.

3. The objective lens according to claim 1, wherein a distance between the lowermost position in the z-direction of the inner pole shoe and the lower end of the beam tube is larger than 9 mm.

4. The objective lens according to claim 1, wherein the electrostatic field and the magnetic field overlap by less than 5%.

5. The objective lens according to claim 1, wherein the beam tube extends through an opening of the outer pole shoe formed by a lowermost region in z-direction of the outer pole shoe and the lower end of the beam tube is disposed spaced apart in the z-direction from the opening of the outer pole shoe.

6. The objective lens according to claim 1, wherein the lower end of the beam tube comprises an end flange extending radially beyond an outer diameter of the beam tube.

7. The objective lens according to claim 6, wherein the end flange comprises a transition from a front face to a sheath section, wherein the transition is rounded in an axial cross-section, a radius of curvature of the rounding being more than 1 mm.

8. The objective lens according to claim 1, wherein a distance between the lower end of the beam tube and a lower end of the terminal electrode is larger than 3 mm.

9. The objective lens according to claim 1, wherein the terminal electrode tapers conically substantially up to a central opening in the terminal electrode.

10. The objective lens according to claim 9, wherein an inner diameter of the opening of the terminal electrode corresponds substantially to an inner diameter of the beam tube.

11. The objective lens according to claim 1, wherein the outer pole shoe tapers downwards.

12. The objective lens according to claim 1, wherein said gap spacing of the pole shoe gap is larger than 3 mm.

13. The objective lens according to claim 1, wherein the inner pole shoe extends upwards as a cylinder sheath from its lower end over approximately 1 mm to 2 mm and is then conically enlarged.

14. The objective lens according to claim 1, wherein the inner pole shoe has an inner diameter of 6 mm to 8 mm at its lower end.

15. An objective lens for an electron microscopy system with magnetic and electrostatic focusing for inspecting an object positionable in an object plane, comprising:
    a pole shoe arrangement for generating a focusing magnetic field, which pole shoe arrangement is substantially rotationally symmetric about an optical axis of the objective lens extending in a z-direction and comprises an inner pole shoe and an outer pole shoe, wherein a pole shoe gap is formed between the inner and outer pole shoes at a lowermost position in the z-direction of the inner pole shoe, the pole shoe gap including a gap spacing oriented in the z-direction between the outer pole shoe and the inner pole shoe;
    a coil body disposed in a space between the inner and the outer pole shoes; and
    an electrode arrangement for generating a focusing electrostatic field, which electrode arrangement is substantially rotationally symmetric about the optical axis and comprises a beam tube which extends along the optical axis through the inner pole shoe and has a lower end, and a terminal electrode disposed spaced apart from the lower end of the beam tube,
    wherein the outer pole shoe is delimited on the outside substantially by a cone surface with respect to the z-direction, wherein the terminal electrode is delimited on the outside substantially by a cone surface with respect to the z-direction, and wherein the terminal electrode is magnetically coupled to the outer pole shoe with a gap therebetween, for reducing the magnetic field in the object plane.

16. The objective lens according to claim 15, wherein the objective lens is provided such that a working distance between the terminal electrode and the object plane is smaller than 2 mm for electrons which pass through the beam tube at energies of about 30 keV.

17. The objective lens according to claim 15, wherein the gap between the terminal electrode and the outer pole shoe is smaller than 0.6 mm.

18. The objective lens according to claim 15, wherein a surface portion of the terminal electrode and a surface portion of the outer pole shoe are opposed to each other.

19. The objective lens according to claim 15, wherein a distance between the lowermost position in the z-direction of the inner pole shoe and the lower end of the beam tube is larger than 9 mm.

20. The objective lens according to claim 15, wherein the electrostatic field and the magnetic field overlap by less than 5%.

21. The objective lens according to claim 15, wherein the beam tube extends through an opening of the outer pole shoe formed by a lowermost region in z-direction of the outer pole shoe and the lower end of the beam tube is disposed spaced apart in the z-direction from the opening of the outer pole shoe.

22. The objective lens according to claim 21, wherein the lower end of the beam tube comprises an end flange extending radially beyond an outer diameter of the beam tube.

23. The objective lens according to claim 22, wherein the end flange comprises a transition from a front face to a sheath section, wherein the transition is rounded in an axial cross-section, a radius of curvature of the rounding being more than 1 mm.

24. The objective lens according to claim 15, wherein a distance between the lower end of the beam tube and the lower end of the terminal electrode is larger than 3 mm.

25. The objective lens according to claim 15, wherein the terminal electrode tapers conically substantially up to a central opening in the terminal electrode.

26. The objective lens according to claim 25, wherein an inner diameter of the opening of the terminal electrode corresponds substantially to an inner diameter of the beam tube.

27. The objective lens according to claim 15, wherein the outer pole shoe tapers downwards.

28. The objective lens according to claim 15, wherein said gap spacing of the pole shoe gap is larger than 3 mm.

29. The objective lens according to claim 15, wherein the inner pole shoe extends upwards as a cylinder sheath from its lower end over approximately 1 mm to 2 mm and is then conically enlarged.

30. The objective lens according to claim 15, wherein the inner pole shoe has an inner diameter of 6 mm to 8 mm at its lower end.

31. An objective lens for an electron microscopy system with magnetic and electrostatic focusing for inspecting an object positionable in an object plane, comprising:
a pole shoe arrangement for generating a focusing magnetic field, which pole shoe arrangement is substantially rotationally symmetric about an optical axis of the objective lens extending in a z-direction and comprises an inner pole shoe and an outer pole shoe, wherein a pole shoe gap is formed between the inner and outer pole shoes at a lowermost position in the z-direction of the inner pole shoe, the pole shoe gap including a gap spacing oriented in the z-direction between the outer pole shoe and the inner pole shoe;
a coil body disposed in a space between the inner and the outer pole shoes; and
an electrode arrangement for generating a focusing electrostatic field, which electrode arrangement is substantially rotationally symmetric about the optical axis and comprises a beam tube which extends along the optical axis through the inner pole shoe and has a lower end, and a terminal electrode disposed spaced apart from the lower end of the beam tube,
wherein a distance between the lowermost position in the z-direction of the inner pole shoe and the lower end of the beam tube is larger than 9 mm.

32. The objective lens according to claim 31, wherein the distance between the lowermost position in the z-direction of the inner pole shoe and the lower end of the beam tube is larger than 10 mm.

33. The objective lens according to claim 31, wherein the electrostatic field and the magnetic field overlap by less than 5%.

34. The objective lens according to claim 31, wherein the beam tube extends through an opening of the outer pole shoe formed by a lowermost region in the z-direction of the outer pole shoe and the lower end of the beam tube is disposed spaced apart in the z-direction from the opening of the outer pole shoe.

35. The objective lens according to claim 34, wherein the lower end of the beam tube comprises an end flange extending radially beyond an outer diameter of the beam tube.

36. The objective lens according to claim 35, wherein the end flange comprises a transition from a front face to a sheath section, wherein the transition is rounded in an axial cross-section, a radius of curvature of the rounding being more than 1 mm.

37. The objective lens according to claim 31, wherein a distance between the lower end of the beam tube and a lower end of the terminal electrode is larger than 3 mm.

38. The objective lens according to claim 31, wherein the terminal electrode tapers conically substantially up to a central opening in the terminal electrode.

39. The objective lens according to claim 38, wherein an inner diameter of the opening of the terminal electrode corresponds substantially to an inner diameter of the beam tube.

40. The objective lens according to claim 31, wherein the inner pole shoe extends upwards as a cylinder sheath from its lower end over approximately 1 mm to 2 mm and is then conically enlarged.

41. An examination system for observing and manipulating an object to be examined, comprising:
an electron microscopy system with an objective lens according to claim 1,
an ion beam processing system for manipulating the object with an emitted ion beam, and
an object support for holding and orienting the object in front of the ion beam processing system and the electron microscopy system by means of which a two-dimensionally extended object can be oriented in front of the electron microscopy system and the ion beam processing system such that the ion beam intersects the object surface orthogonally.

42. The examination system according to claim 41, wherein the object can be oriented in front of the electron microscopy system and the ion beam processing system such that the ion beam intersects the object surface at an angle deviating from the orthogonal up to about 2°.

43. An examination system for observing and manipulating an object to be examined, comprising:
an electron microscopy system with an objective lens according to claim 15,
an ion beam processing system for manipulating the object with an emitted ion beam, and
an object support for holding and orienting the object in front of the ion beam processing system and the electron microscopy system by means of which a two-dimensionally extended object can be oriented in front of the electron microscopy system and the ion beam processing system such that the ion beam intersects the object surface orthogonally.

44. The examination system according to claim 43, wherein the object can be oriented in front of the electron microscopy system and the ion beam processing system such that the ion beam intersects the object surface at an angle deviating from the orthogonal up to about 2°.

45. An examination system for observing and manipulating an object to be examined, comprising:

an electron microscopy system with an objective lens according to claim 31, an ion beam processing system for manipulating the object with an emitted ion beam, and an object support for holding and orienting the object in front of the ion beam processing system and the electron microscopy system by means of which a two-dimensionally extended object can be oriented in front of the electron microscopy system and the ion beam processing system such that the ion beam intersects the object surface orthogonally.

46. The examination system according to claim 45, wherein the object can be oriented in front of the electron microscopy system and the ion beam processing system such that the ion beam intersects the object surface at an angle deviating from the orthogonal up to about 2°.

47. The objective lens according to claim 1, wherein the outer pole shoe is delimited on the outside substantially by a cone surface with the cone angle a with respect to the z-direction, wherein the terminal electrode is delimited on the outside substantially by a cone surface with respect to the z-direction, and wherein the terminal electrode is magnetically coupled to the outer pole shoe via a gap therebetween, said gap between the terminal electrode and the outer pole shoe channeling magnetic flux between the terminal electrode and the outer pole shoe and away from the object plane.

48. The objective lens according to claim 15, wherein the gap between the terminal electrode and the outer pole shoe is smaller than 0.2 mm.

49. An objective lens for an electron microscopy system with magnetic and electrostatic focusing for inspecting an object positionable in an object plane, comprising:

a pole shoe arrangement for generating a focusing magnetic field, which pole shoe arrangement is substantially rotationally symmetric about an optical axis of the objective lens extending in a z-direction and comprises an inner pole shoe and an outer pole shoe, wherein a pole shoe gap is formed between the inner and outer pole shoes at a lowermost position in the z-direction of the inner pole shoe, the pole shoe gap including a gap spacing oriented in the z-direction between the outer pole shoe and the inner pole shoe;

a coil body disposed in a space between the inner and the outer pole shoes; and an electrode arrangement for generating a focusing electrostatic field, which electrode arrangement is substantially rotationally symmetric about the optical axis and comprises a beam tube which extends along the optical axis through the inner pole shoe and has a lower end, and a terminal electrode disposed spaced apart from the lower end of the beam tube, wherein the outer pole shoe is delimited on the outside substantially by a cone surface with respect to the z-direction, wherein the terminal electrode is delimited on the outside substantially by a cone surface with respect to the z-direction, and wherein the terminal electrode is magnetically coupled to the outer pole shoe via a gap therebetween, said gap between the terminal electrode and the outer pole shoe channeling magnetic flux between the terminal electrode and the outer pole shoe and away from the object plane.

50. The objective lens according to claim 49, wherein the gap between the terminal electrode and the outer pole shoe is smaller than 0.6 mm.

51. The objective lens according to claim 49, wherein the gap between the terminal electrode and the outer pole shoe is smaller than 0.2 mm.

* * * * *

UNITED STATES PATENT AND TRADEMARK OFFICE
CERTIFICATE OF CORRECTION

PATENT NO. : 6,855,938 B2
DATED : April 14, 2005
INVENTOR(S) : Preikszas et al.

It is certified that error appears in the above-identified patent and that said Letters Patent is hereby corrected as shown below:

<u>Column 8,</u>
Line 7, "... for the pole shoes is" should read -- ... for the pole shoes. --

<u>Column 9,</u>
Line 1, "... Apart from that, other possible of application are conceivable." should read -- "... Apart from that, other possible applications are conceivable. --

<u>Column 10,</u>
Line 38, "In is embodiment ..." should read -- In this embodiment ... --
Line 60, "... space enclosed by the pole shoes 111, 122 ..." should read -- ... space enclosed by the pole shoes 111, 112 ... --

Signed and Sealed this

Seventh Day of June, 2005

JON W. DUDAS
*Director of the United States Patent and Trademark Office*